(12) United States Patent
Mok

(10) Patent No.: US 7,079,394 B2
(45) Date of Patent: Jul. 18, 2006

(54) COMPACT COOLING DEVICE

(75) Inventor: Lawrence Shungwei Mok, Brewster, NY (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/338,347

(22) Filed: Jan. 8, 2003

(65) Prior Publication Data

US 2006/0034055 A1    Feb. 16, 2006

(51) Int. Cl.
*H05K 7/20* (2006.01)
(52) U.S. Cl. .................. 361/700; 361/695; 361/719; 165/80.3; 165/80.4; 257/715; 257/722
(58) Field of Classification Search ........ 361/687–690, 361/694–700, 717–720; 257/712–715; 174/15.1, 174/15.2, 16.1, 16.3; 165/80.3, 80.4, 185, 165/104.21, 104.33
See application file for complete search history.

(56) References Cited

U.S. PATENT DOCUMENTS

| | | | | |
|---|---|---|---|---|
| 6,111,748 A * | 8/2000 | Bhatia | ................ | 361/695 |
| 6,166,906 A * | 12/2000 | Sun et al. | ................ | 361/697 |
| 6,373,700 B1 * | 4/2002 | Wang | ................ | 361/698 |
| 6,442,025 B1 * | 8/2002 | Nakamura et al. | ........... | 361/695 |
| 6,504,711 B1 * | 1/2003 | Wu et al. | ................ | 361/687 |
| 6,560,104 B1 * | 5/2003 | DeHoff et al. | ............... | 361/687 |
| 6,567,269 B1 * | 5/2003 | Homer et al. | ............... | 361/700 |
| 6,606,254 B1 * | 8/2003 | Yoneda | .................... | 361/799 |
| 6,643,129 B1 * | 11/2003 | Fujiwara | ................ | 361/687 |
| 6,652,223 B1 * | 11/2003 | Horng et al. | ............... | 415/53.1 |

\* cited by examiner

*Primary Examiner*—Boris Chérvinsky
(74) *Attorney, Agent, or Firm*—VanLeeuwen & VanLeeuwen; Carlos Munez-Bustamante

(57) ABSTRACT

A cooling device for a chip in a portable computer that uses a horizontal flat fan in the corner of a portable computer housing with air outlets through heatsinks that enhance exhaust air flow over heat pipes from the chip and out through the computer housing. The exhaust is through the adjacent vertical walls of the computer housing. Separate heat pipes go directly from the chip to fins located at the outlet at the wall.

8 Claims, 6 Drawing Sheets

COMPACT COOLING DEVICE

FIELD OF THE INVENTION

The invention is in the field of heat dissipation in portable electronic apparatus such as laptop computers where size, weight, and power consumption are constrained and in particular to heat transfer and cooling of heat produced in semiconductor chips used in such electronic apparatus.

BACKGROUND

The power consumption of laptop computers, especially the power of Central Processing Units (CPUs) such as semiconductor chips used in them, is increasing. For instance, the total power of a laptop computer that was usually in the range of 10 watts, now is around 50 watts. The CPU power has been increased from 2 to about 18 watts and in the future it could reach 40 watts. Most of this power will be dissipated as heat to the surroundings. Getting more heat out of a laptop computer efficiently is becoming urgent.

RELATION TO THE PRIOR ART

Although the idea of transferring heat from one place to another for dissipation is well known, the ability to transfer is constrained in the portable computer type of apparatus by the type of housing generally employed which is a shallow base with a hinged upper portion and by the air flow in that housing. There has been some work in the art as may be seen in the following documents.

In U.S. Pat. No. 6,105,662, titled "Cooling System for Electronic Packages", there is taught a cooling system including a heat radiator or heat sink connected to a heat conducting plate by means of a particular tube-like heat conducting element for heat transfer.

In U.S. Pat. No. 6,111,748, titled "Flat Fan Heat Exchanger and Use Thereof in a Computing Device", there is taught a fan heat exchanger including one type of flat fan that has air coming in from one side and exiting to the opposite side of the fan housing at the same level. The patent shows several fan types in moving air guided with fins, in a typical computer housing.

There is developing a need in the art to move larger amounts of air in order to carry the ever increasing heat from the CPU chip or chips to the outside of the computer housing.

SUMMARY OF THE INVENTION

A cooling device for a portable computer is provided that uses a flat fan having air inlet capability into the fan housing near the propeller shaft of the fan and having dual air outlets through the fan housing, in combination with dual finned heat sink exhaust air outlets through the computer housing. Each exhaust air outlet through the computer housing being independently connected via a separate heat pipe to the relatively physically small heat source of the computer such as a semiconductor chip. The air outlets and heat sinks exhaust through the adjacent vertical walls of the computer housing producing a situation where input air comes into the fan housing parallel to, and exits perpendicular to,the shaft or axis of the fan. Each air outlet heatsink combination is provided with fins that together with position enhance volume of air flow. The heat from the chip is thus conveyed for transfer into the exhaust air at the exit point from the computer housing.

DESCRIPTION OF THE INVENTION

Figure 1:
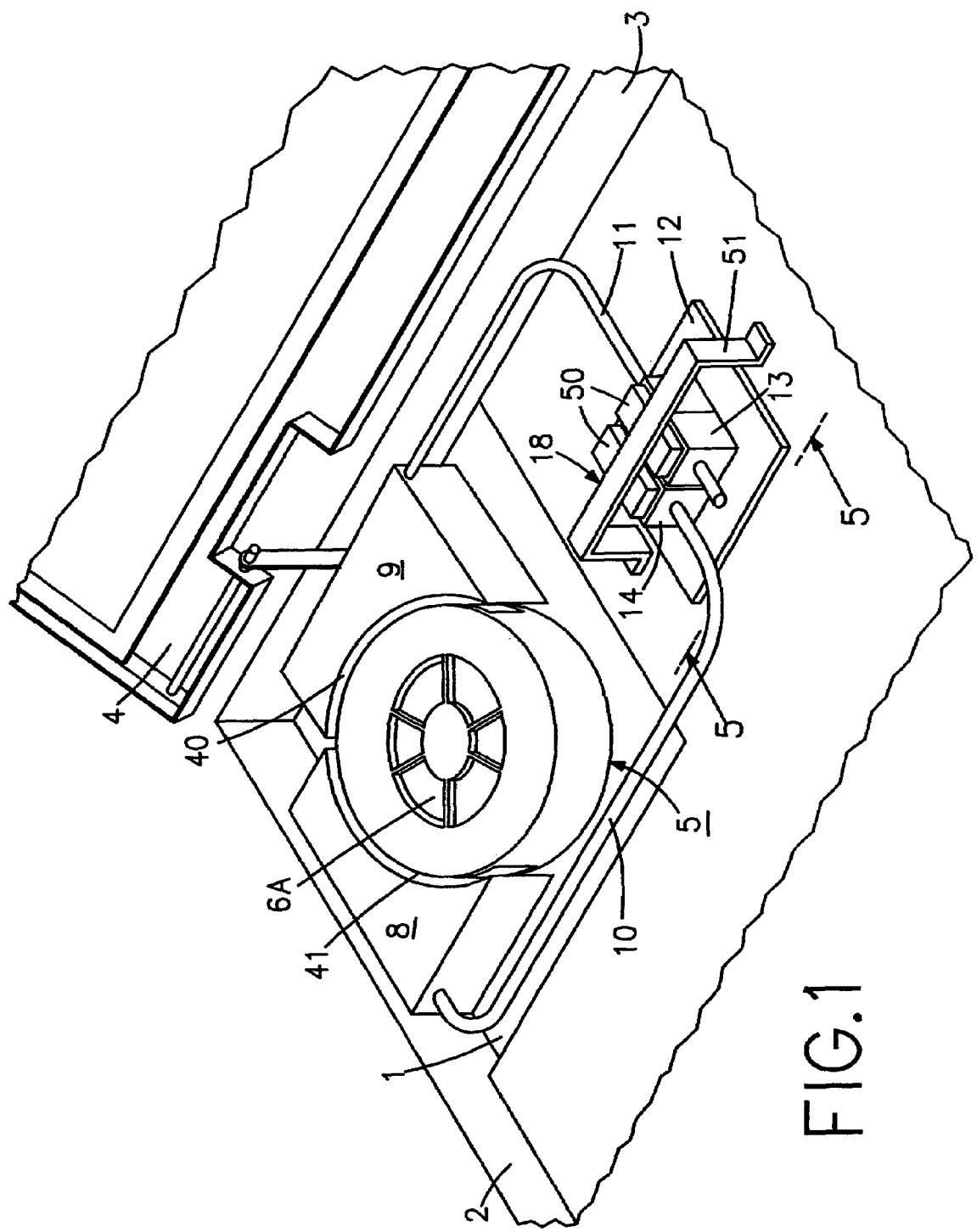
FIG. 1 is a perspective depiction of the elements of the invention positioned at an intersection of housing walls in a laptop computer.
Figure 2:
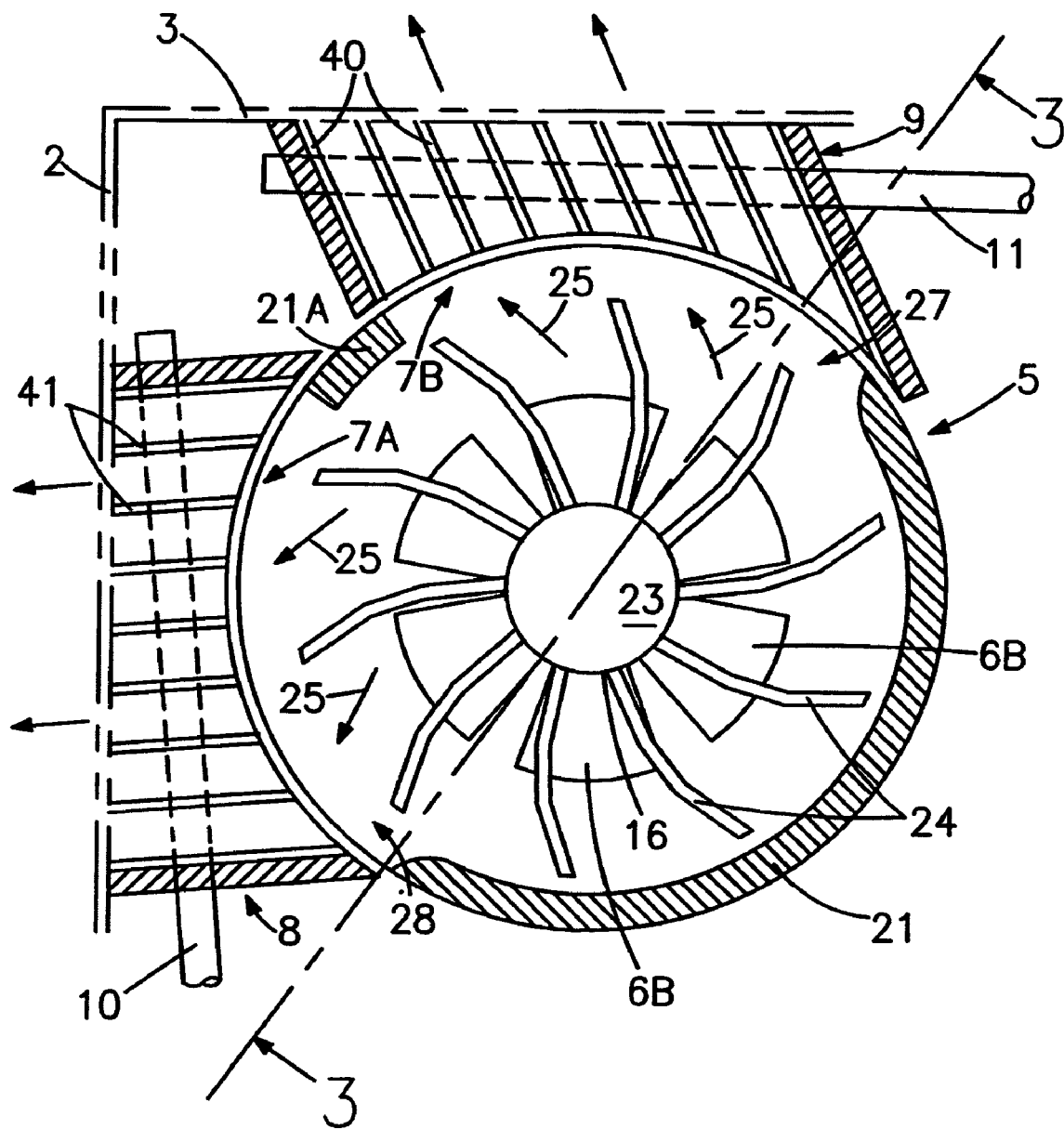
FIG. 2 is a top view of the flat fan assembly combined with the finned heatsink air outlets.

Referring to FIG. 1 a perspective depiction is provided of the elements of the invention positioned at an intersection of housing walls in a laptop computer and to FIG. 2 which is a top view of the flat fan assembly combined with the finned heatsink air outlets. The base 1 of the computer has intersecting walls 2 and 3 and a hinged display member 4.

The flat fan assembly 5 is in a horizontal position at the intersection of the walls 2 and 3. The assembly 5 has air inlets 6A on the upper side, which is shown removed in FIG. 2, and 6B on the lower side. The flat fan assembly 5 further has air outlet regions 7A and 7B that are not visible in FIG. 1, and are separated around the periphery of the fan assembly 5 in FIG. 2. The regions 7A and 7B are each in a combination with air flow enhanced heat sink members 8 and 9, and in turn are each independently connected via separate heat pipes 10 and 11 to a physically small heat source 12 such as a semiconductor chip, located under the ends of the heat pipes 13 and 14 not visible in this figure, and mounted on a substrate board 15. The air inlets 6A and 6B, are near the axis 16 of the fan assembly 5. The structure of FIGS. 1 and FIG. 2 produce a situation where input air comes into the fan assembly 5 parallel to, and exits perpendicular to, the axis 16 of the fan.

Each heatsink member 8 and 9 is provided with fins that enhance air flow. The fins are not visible in FIG. 1 and are labelled 40 and 41 in FIG. 2. The heat is conveyed through the separate heat pipes 10 and 11 from the chip 12 to the separate heatsinks 8 and 9 so that the heat pipes 10 and 11 each transfers all heat at the exit, 40 through wall 3, 41 through wall 2, of the computer housing. A clamping mechanism 18 in FIG. 1 is used to hold the two heat pipe ends 13 and 14 in good thermal contact with the chip package. The structural details of the compact cooling device are further shown in FIG. 2 which is a top view of the flat fan assembly 5 in combination with the finned heatsink air outlets 8 and 9. Considering the structure and operation of the invention in FIG. 2, which is the flat fan housing 5 of FIG. 1 with the cover containing air inlets 6A removed permitting viewing inlets 6B.

The housing 5 has portions 21 and 21A that hold the parts containing the air inlets 6A and 6B apart and define the air outlet openings 7A and 7B. The shaft 23 holds the fan motor 22, not shown. Numerous fan blades 24 are attached to the shaft 23. With counter clockwise rotatation the outgoing air, as indicated by the arrows labelled 25 moves at higher volume where the air outlet heatsinks 8 and 9 are at less than the right angle of the computer housing walls 2 and 3.

It will be apparent that the shape of the fan housing 5, the number of the fan blades 24, and the number of openings at the air inlets 6A and 6B are exemplary and should not be limited to those shown in the figure. The construction of the fins 40 and 41 of the invention are arranged for maximum air flow volume enhancement, they vary in length and distance apart and the fin assemblies depart from being perpendicular to the sides 2 and 3 in the direction of tangency to the air flow 25 direction in the fan.

Figure 3:
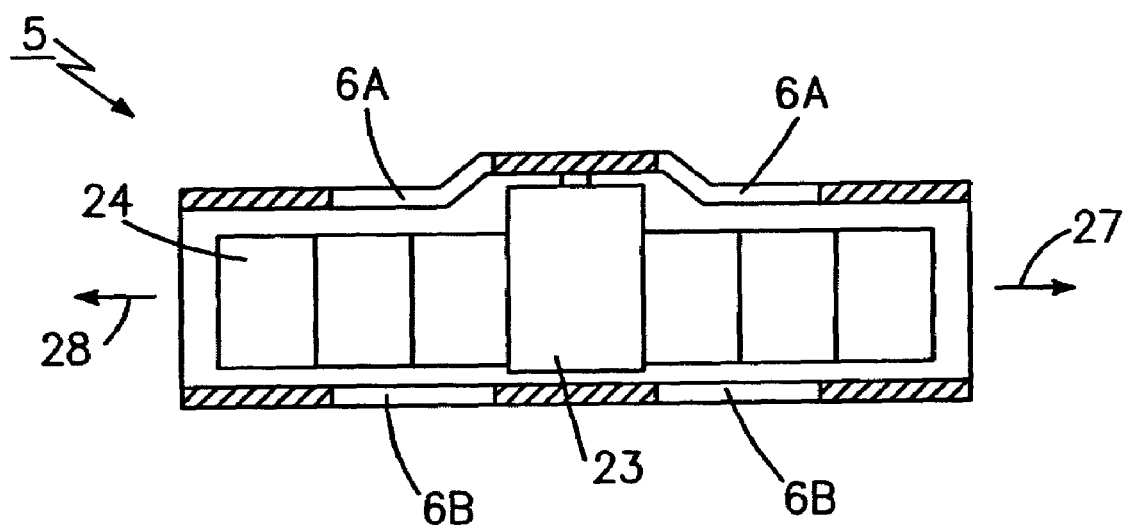
FIG. 3 is a cross-sectional view of the flat fan of the invention illustrating the air inlets and air outlets.

Referring to FIG. 3 where the fan in the housing 5 of FIGS. 1 and 2 is shown in cross section in FIG. 3 along the dotted line 3—3 in FIG. 2. The motor and motor shaft 23 is in the center. The majority of the electronics to drive the motor is associated with the shaft 23. The air inlets 6A are through the upper cover and the air inlets 6B are through the lower cover. The air outlets 27 and 28 direct air output through to the heatsinks 8 and 9 as directed by elements 21 and 21A, out of view in FIG. 3.

Figure 4A:
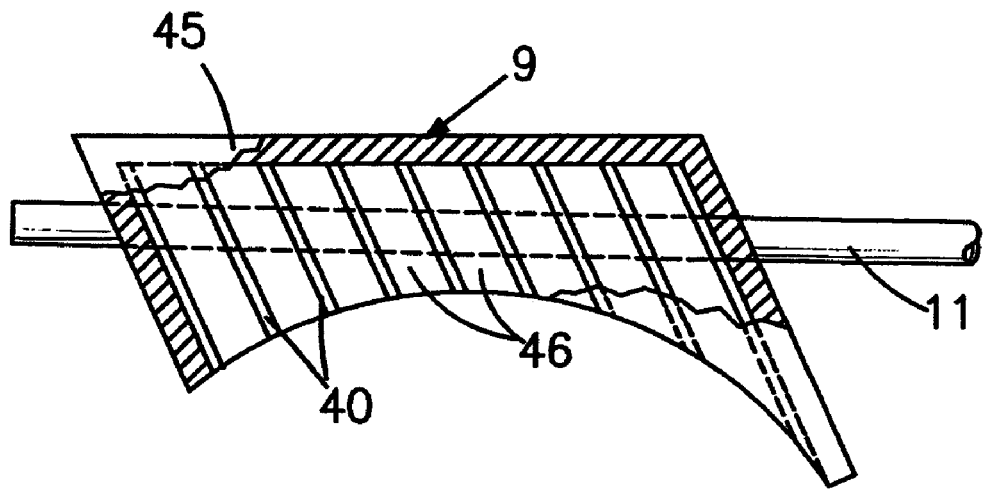
FIGS. 4a and 4b are top and side view depictions respectively for an end of a heat pipe passing through a fin assembly.
Figure 4B:
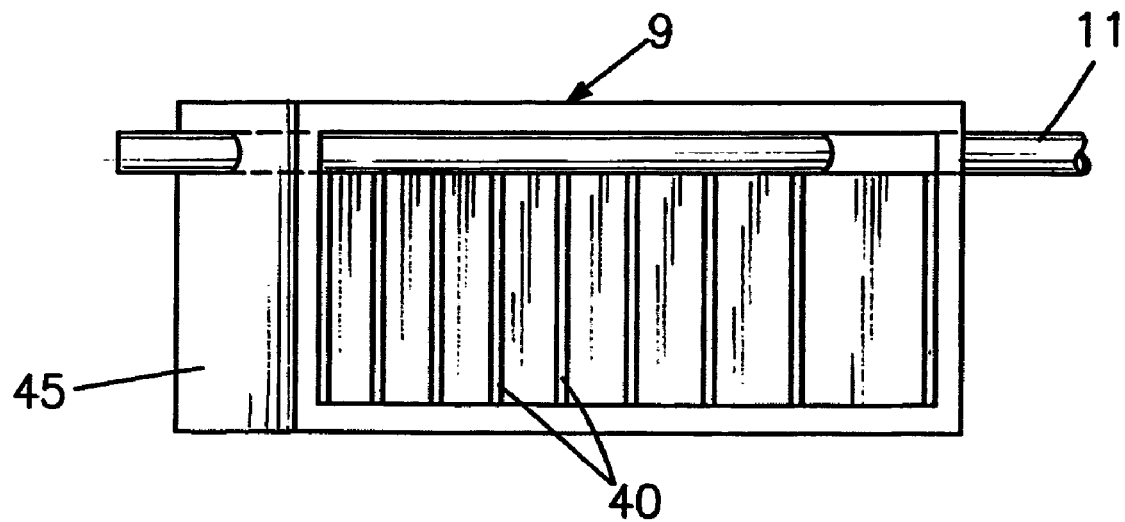

Referring to FIG. 4 there are side and top view depictions labelled FIGS. 4A and 4B respectively showing the end of the heat pipe 11 shown dotted in FIG. 2, passing through the fin assembly 40 of heatsink 8. The structure of the two air heatsink outlets 8 and 9 are identical in principle as depicted in FIG. 2. As indicated in the side view of the air outlet heatsink 8 in FIG. 4a, one end of the heat pipe 11 is inserted at its main body with numerous fins 40 protruded outward. The air outlet heatsink 8 and its fins 40 are made of thermally conductive materials such as aluminum or copper. A cover 45 surrounding the fins 40 to protect the fins and guide the air flow may be provided. As illustrated in FIG. 4B the spacing 46 between the fins varies according to the length of the fins. Further, as illustrated in both FIG. 2 and FIG. 4 the fin length varies to conform with the shape of the fan outlet 27.

Figure 5:
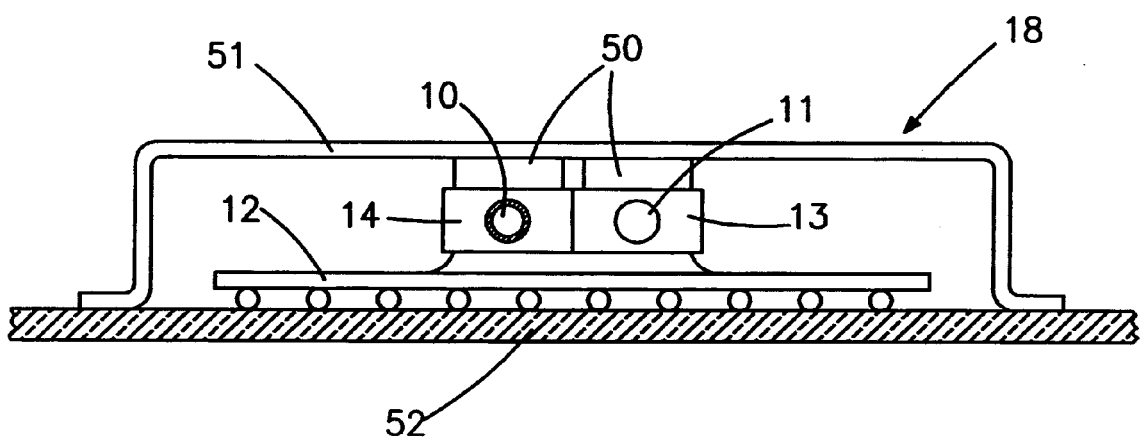
FIG. 5 is a side view depiction of the assembly of the separate heat pipes in contact with a single heat generating source such as a semiconductor chip on a printed-wiring board.

Referring to FIG. 5 there is shown a side view of the clamping mechanism to bring the heat pipes in contact with the heat generating semiconductor chip 12. The semiconductor chip 12 is soldered on a printed-wiring board 52. The two connection blocks 13 and 14 with heat pipes 10 and 11 inserted within are placed on the top of the semiconductor chip 12. The connection blocks are forced into a good thermal contact with the chip 12 by two elastomer or spring pieces 50 using a clamp 51 which is anchored on the printed-wiring board 52.

Figure 6:
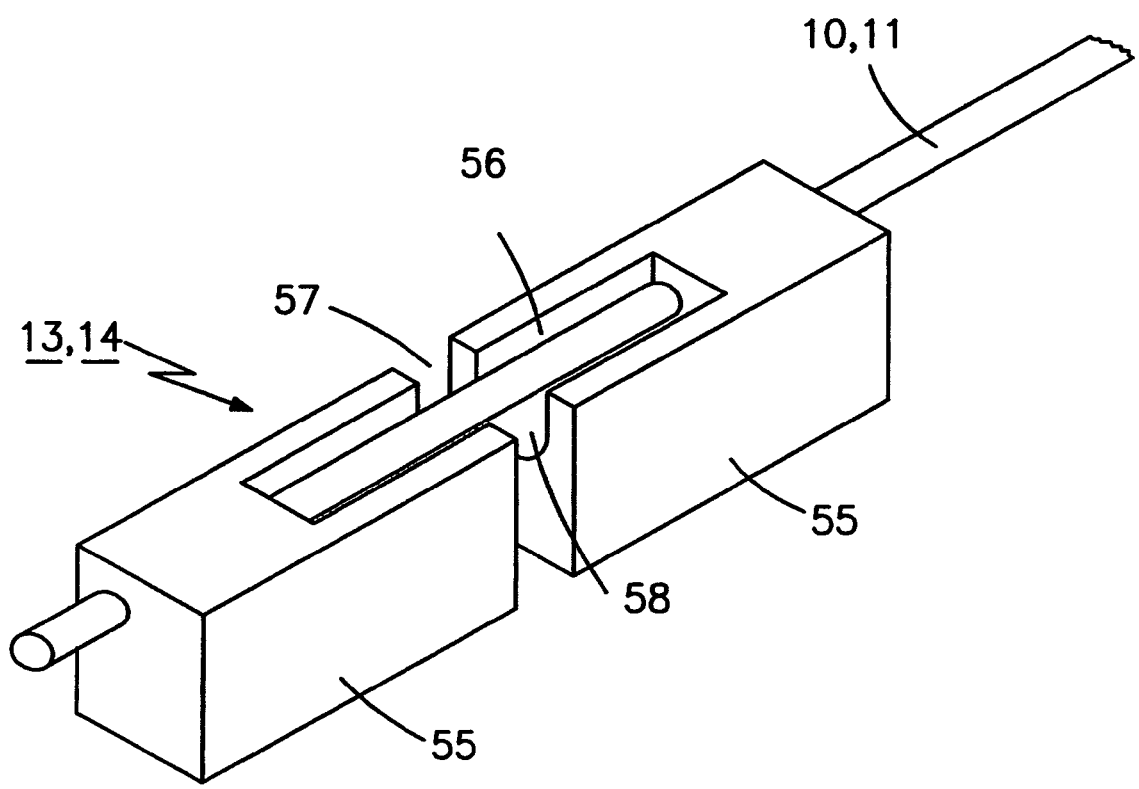
FIG. 6 is a perspective depiction of connection blocks use in retaining an end of a heat pipe.

The heat pipe structures lend themselves to variety of arrangements. As shown in FIG. 6, the connection block 55 consists of two pieces. One end of the connection block piece has a trough-like cut 56. The heat pipe 10 is inserted into the two connection block pieces with the trough-like cuts facing each other. The two connection block pieces are separated by a clearance 57. The dimension of the trough-like cut is made larger than the diameter of the heat pipe such that there is a free space 58 under and around the heat pipe within the cut 56. The two connection block pieces pick up the heat from the semiconductor chip and conduct it to the heat pipe. This two-piece structure of the connection block provides a certain degree of the freedom for the connection blocks to make a compliant contact with the surface of the semiconductor chip. A reliable and efficient thermal contact is therefore ensured. The thermal contact can be improved further if the spaces between the block pieces and the spaces within the trough-like cut in the block pieces are filled with thermally conductive fluid-like or gel-like materials such as thermal pastes.

What has been described is device principle for heat dissipation in portable electronic apparatus such as laptop computers where size, weight, and power consumption are constrained.

What is claimed is:

1. A method of transferring heat in a portable computing apparatus that includes vertical walls surrounding a base portion and is powered by a central processing unit, the method comprising:
    positioning, a fan of a flat type having an impeller rotatable in a circular housing and positioned on a shaft where the impeller rotation is perpendicular to said shaft, the fan being positioned at a location in said base portion at an intersection of a first and second of said vertical walls and each of said first and second walls has a location that is in a tangential relationship to said circular housing,
    modifying said fan so that input air enters said circular housing in the vicinity of said shaft and is forced out of first and second exhaust openings in said circular housing that coincide with said tangential relationship locations of said first and second walls when said impeller rotates,
    providing first and second air exhaust openings through one or more of the vertical walls at said tangential relationship locations, and,
    providing an air flow enhancing member that includes an exhaust air conduit between said exhaust openings in said fan housing and said exhaust openings through said vertical walls of said computer base portion.

2. The method of claim 1 wherein providing the air flow enhancing member includes positioning of fins in said exhaust openings.

3. The method of claim 2 further comprising:
    providing heat pipe thermal transfer capability from said central processing unit to said exhaust openings through said vertical walls.

4. The method of claim 1 further comprising:
    providing an exhaust air heat transfer enhancement, wherein the exhaust air heat transfer enhancement is selected from the group of fin spacing and heat pipe positioning.

5. The method of claim 3 wherein the heat pipe thermal transfer capability from said central processing unit is to and through each of said fins.

6. The method of claim 5 further comprising:
    providing thermal attachment of a first end of said heat pipe to said central processing unit and the remaining end of said heat pipe to said fins.

7. The method of claim 6 further comprising:
    providing a separate heat pipe extending from said central processing unit to one or more of the exhaust openings.

8. The method of claim 7 further comprising:
    providing a separate heat pipe extending from said central processing unit to one or more of the exhaust openings and into thermal contact with at least one fin in said exhaust openings.

* * * * *